(12) United States Patent
Kim

(10) Patent No.: US 11,062,919 B2
(45) Date of Patent: Jul. 13, 2021

(54) DIKE FOR SEMICONDUCTOR/LCD MANUFACTURING AND PROCESSING EQUIPMENT

(71) Applicant: Jung Soo Kim, Cheonan-si (KR)

(72) Inventor: Jung Soo Kim, Cheonan-si (KR)

( * ) Notice: Subject to any disclaimer, the term of this patent is extended or adjusted under 35 U.S.C. 154(b) by 0 days.

(21) Appl. No.: 16/822,827

(22) Filed: Mar. 18, 2020

(65) Prior Publication Data

US 2021/0066095 A1 Mar. 4, 2021

(30) Foreign Application Priority Data

Sep. 2, 2019 (KR) .................. 10-2019-0108060

(51) Int. Cl.
| | |
|---|---|
| *H01L 21/67* | (2006.01) |
| *H01L 21/02* | (2006.01) |
| *B29C 45/00* | (2006.01) |
| *B29C 45/14* | (2006.01) |
| *B29C 45/26* | (2006.01) |
| *B29K 63/00* | (2006.01) |
| *B29K 627/18* | (2006.01) |
| *B29L 31/10* | (2006.01) |

(52) U.S. Cl.
CPC .... *H01L 21/67017* (2013.01); *B29C 45/0001* (2013.01); *B29C 45/14336* (2013.01); *B29C 45/2602* (2013.01); *H01L 21/02041* (2013.01); *H01L 21/6715* (2013.01); *B29K 2063/00* (2013.01); *B29K 2627/18* (2013.01); *B29L 2031/10* (2013.01)

(58) Field of Classification Search
CPC ......... H01L 21/67017; H01L 21/67028; H01L 21/6704; H01L 21/67051; H01L 21/02041; H01L 21/6715; A47K 3/008; A47K 3/28; A47K 3/40; A47K 3/405
USPC ............................................................. 4/613
See application file for complete search history.

(56) References Cited

U.S. PATENT DOCUMENTS

| | | | | |
|---|---|---|---|---|
| 8,474,069 | B1 * | 7/2013 | Whitinger | E03F 5/0408 |
| | | | | 4/613 |
| 8,505,131 | B2 * | 8/2013 | Doolittle | E03F 5/0408 |
| | | | | 4/613 |
| 9,179,807 | B2 * | 11/2015 | Campbell | A47K 3/40 |
| 2014/0230140 | A1 * | 8/2014 | Davis, Jr. | A47K 3/40 |
| | | | | 4/613 |

FOREIGN PATENT DOCUMENTS

| | | | | |
|---|---|---|---|---|
| CA | 2904684 | A1 * | 9/2014 | ............ A47K 3/405 |
| DE | 3619405 | A1 * | 12/1987 | ............ E03F 5/0407 |
| DE | 202017101874 | U1 * | 4/2017 | ............ A47K 3/405 |
| KR | 10-1128298 | B1 | 3/2012 | |
| KR | 10-2016-0006964 | A | 1/2016 | |
| KR | 10-1615518 | B1 | 4/2016 | |

* cited by examiner

*Primary Examiner* — Michael Safavi
(74) *Attorney, Agent, or Firm* — KORUS Patent, LLC; Seong Il Jeong

(57) ABSTRACT

Disclosed is a dike for semiconductor/LCD manufacturing and processing equipment, in which a plurality of straight blocks and a plurality of corner blocks, having a predetermined height, are engaged to form a polygonal-shaped fence having a predetermined area, and molten epoxy is injected to a predetermined height in the space within the fence and solidified.

4 Claims, 8 Drawing Sheets

DIKE FOR SEMICONDUCTOR/LCD MANUFACTURING AND PROCESSING EQUIPMENT

BACKGROUND OF THE INVENTION

Field of the Invention

The present invention relates to a dike for semiconductor/LCD manufacturing and processing equipment (hereinafter, referred to as "semiconductor-manufacturing equipment"), and more particularly to technology for forming a dike for receiving and collecting contaminants that scatter or leak to the surrounding floor from semiconductor-manufacturing equipment that uses liquid such as water or chemicals.

Description of the Related Art

In general, semiconductor-manufacturing equipment includes equipment for performing processes such as chemical vapor deposition, etching, or cleaning, and this equipment is installed on a porous floor of a building and uses liquid such as water, solvents, and chemicals. There is a problem in that liquid scatters or leaks outside the semiconductor-manufacturing equipment onto the floor during operation, thus contaminating the workplace.

In order to solve this problem, a dike for collecting liquid that leaks or scatters is installed on the surrounding floor of a building on which the semiconductor-manufacturing equipment is installed. As a conventional patent technology associated with a dike, Korean Patent Registration No. 10-1615518, which was filed by and granted to the present applicant, discloses a dike for semiconductor/LCD chemical cleaning equipment, which relates to a dike B installed around the lower portion of semiconductor/LCD chemical cleaning equipment A in order to receive and store cleaning solution that leaks or scatters from the cleaning equipment.

In more detail, as shown in FIG. 1, the dike B of the above conventional patent technology is formed in a manner such that a polygonal-shaped fence is formed using a protective wall having a predetermined height on the floor around the cleaning equipment A so as to receive and store cleaning solution that leaks or scatters from the cleaning equipment, and an epoxy 50 is applied to the floor within the polygonal-shaped fence to a height lower than the protective wall and solidified.

The protective wall includes an outer wall 11, which has a coupling protrusion 13 formed on the inner surface thereof, and an inner wall 12, which is coupled to the coupling protrusion 13 and spaced apart from the outer wall 11. The epoxy 50 is applied to the inner side surface of the protective wall and fills the space between the outer wall 11 and the inner wall 12. A holder 71, which has a height greater than the height of the epoxy injected in the space within the protective wall, is installed around a support bar for supporting the cleaning equipment and a connection pipe for connecting the same to external equipment, and silicon 60 is injected into the entire space in the holder 71 and solidified. Contaminants, including cleaning solution that leaks or scatters from the cleaning equipment, are received and stored in the space within the fence in which the epoxy is injected, whereby it is possible to prevent the region below the cleaning equipment and the surroundings thereof from being contaminated and to prevent the spread of contamination.

However, in the above conventional patent technology, in which the coupling protrusion 13 is formed to reinforce the outer wall 11 and the inner wall 12 is coupled to the outer wall 11 by being engaged with the coupling protrusion 13, the outer wall and the inner wall need to be manufactured through separate processes, and a process of coupling the inner wall to the outer wall needs to be additionally performed. Therefore, it takes a long time to form the dike, and the manufacturing costs thereof increase.

In addition, in the above conventional patent technology, in which the fence of the dike is formed by coupling the outer wall 11 and the inner wall 12 and the molten epoxy is injected in the space within the fence, the epoxy may not be completely injected in the gap between the outer wall and the inner wall due to the high viscosity of the molten epoxy. Since the portion of the fence of the dike in which the epoxy is not fully injected has insufficient strength, it is easily broken or damaged by external forces, for example, when stepped on by a worker or touched by a cleaning tool, which leads to a problem of frequent reconstruction of the dike.

In addition, in the above conventional patent technology, since the fence is formed to include corners at which the outer walls 11, to which the inner walls 12 are coupled, join each other perpendicularly, there occurs a problem in that the molten epoxy injected into dike leaks outside through gaps in the corners of the fence.

In addition, in the above conventional patent technology, in which the fence is formed to include corners at which the outer walls 11, to which the inner walls 12 are coupled, join each other perpendicularly, since it is difficult to connect the ends of neighboring outer walls to each other perpendicularly, separate fixtures are used or an installation area needs to be marked in advance on the floor when the dike is constructed, which leads to a problem of complicated and time-consuming installation.

In addition, in the above conventional patent technology, since an epoxy is injected in the dike and solidified in the form of a horizontal plane having a uniform thickness, liquid contaminants generated in the semiconductor-manufacturing equipment are stored to a uniform height in the entire area of the dike, which leads to a problem of slow and difficult collection of the contaminants.

In addition, since general semiconductor-manufacturing equipment including the above conventional patent technology is installed on a porous floor of a building, general pulp paper is laid on the porous floor when the molten epoxy is injected into the dike. However, the molten epoxy permeates the pulp paper and adheres to the floor, which leads to a problem of difficulty of removal of the epoxy from the floor when moving or dismantling the equipment.

SUMMARY OF THE INVENTION

The present invention has been made in view of the above problems, and it is an object of the present invention to provide a dike for semiconductor-manufacturing equipment, which is formed by installing a fence in a predetermined area on a floor of a building on which semiconductor-manufacturing equipment is installed and by injecting molten epoxy into the space within the fence and solidifying the epoxy, and which is capable of increasing the rigidity of the fence, facilitating installation of the fence, preventing the molten epoxy injected in the dike from leaking outside through the corners of the fence, facilitating collection of contaminants accumulated in the dike, and facilitating removal of the epoxy adhered to the floor of the building when dismantling the equipment equipped with the dike.

In order to accomplish the above and other objects, there is provided a dike for semiconductor-manufacturing equipment, in which a plurality of straight blocks and a plurality of corner blocks, having a predetermined height, are engaged to form a fence having a predetermined shape and a predetermined area, and an epoxy in a molten state is injected to a predetermined height in the space within the fence and solidified.

The straight block may include an outer vertical wall and an inner vertical wall, which are formed to have a predetermined length and a predetermined height by injection-molding synthetic resin and are spaced apart from each other by a predetermined width to form a space in which a straight block epoxy is injected, and an installation panel, which is bent at a right angle at the lower end of the outer vertical wall and extends to the inner vertical wall in order to form a bottom of the epoxy-injected space and to enable vertical installation of the straight block on the floor of a building. The inner vertical wall may be shorter than the outer vertical wall so as to form a communication portion, which communicates with the space within the fence. The epoxy in a molten state, which is injected in the space within the fence, may be connected to the straight block epoxy in a solidified state, and may be solidified so as to be integrated with the straight block epoxy.

The corner block may include a first rear vertical panel and a second rear vertical panel, which have a predetermined width and a predetermined height and are integrally formed so as to be connected to each other with a predetermined included angle formed therebetween, and a front vertical panel, which is integrally formed so as to be connected to the front surfaces of the first rear vertical panel and the second rear vertical panel. Coupling gaps, into which the end portions of neighboring straight blocks are fitted, may be respectively formed between the first rear vertical panel and the front vertical panel and between the second rear vertical panel and the front vertical panel.

The coupling gaps may be provided in a pair so as to be connected to each other with a predetermined included angle formed therebetween with respect to the corner. Examples of the corner block may include a right-angle corner block, in which the included angle is a right angle, an acute-angle corner block, in which the included angle is an acute angle, and an obtuse-angle corner block, in which the included angle is an obtuse angle. The fence may be formed using any one selected from among the right-angle corner block, the acute-angle corner block, and the obtuse-angle corner block, or combinations thereof.

The epoxy injected in the dike may be formed as a horizontal epoxy having a uniform thickness on the floor inside the fence. Alternatively, an inclined epoxy block, having an inclined surface inclined at a predetermined angle, may be mounted on a predetermined portion of the top surface of the horizontal epoxy in order to form a contaminant discharge path at the lower end of the inclined surface of the inclined epoxy block, thereby enabling easy and quick collection of contaminants accumulated in the dike.

A TEFLON sheet, having an adhesive attached to the bottom surface thereof, may be adhered to the floor inside the fence, and molten epoxy may be applied to the top surface of the TEFLON sheet and solidified, thereby making it possible to easily remove the epoxy adhered to the floor inside the fence when moving or dismantling semiconductor-manufacturing equipment.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
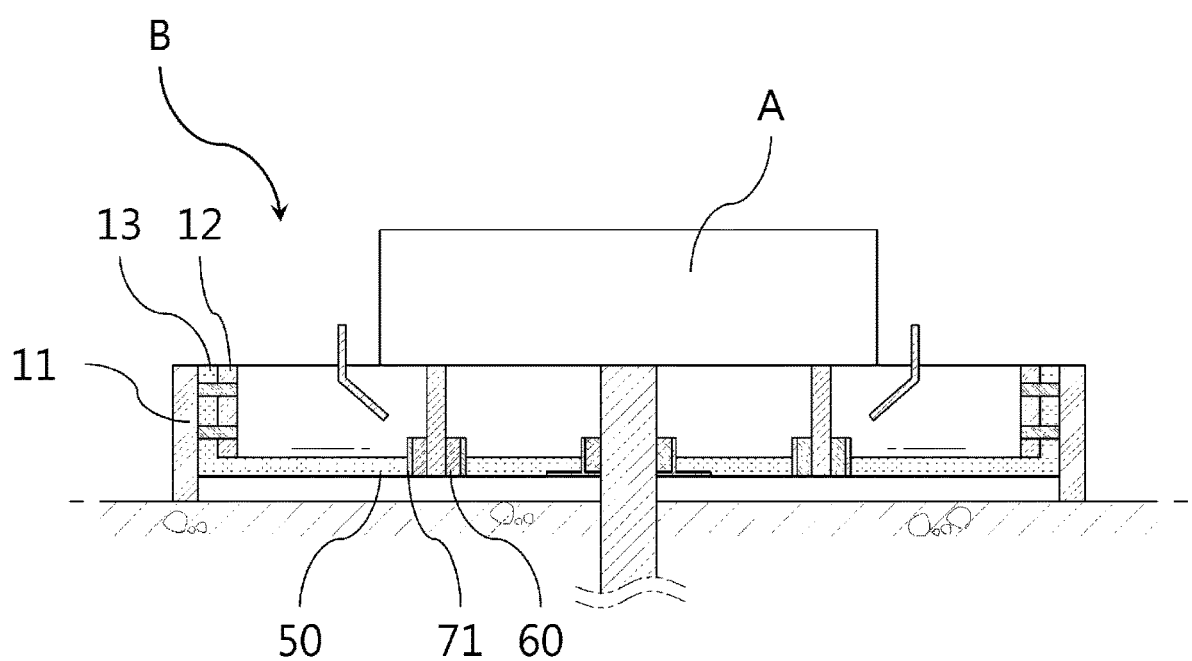
FIG. 1 is a view illustrating a conventional dike for semiconductor-manufacturing equipment.

Embodiments described in the specification and the configuration of elements illustrated in the drawings are merely considered to be preferred embodiments and do not represent all the technical ideas of the present disclosure, and thus it should be understood that various equivalents and modifications may exist at the time of filing this application.

Hereinafter, a dike for semiconductor-manufacturing equipment according to the present invention will be described in detail with reference to the accompanying drawings. In the description of the present invention, the same terms and reference numerals are used to designate components that perform the same functions as those in the conventional art.

Figure 2A:
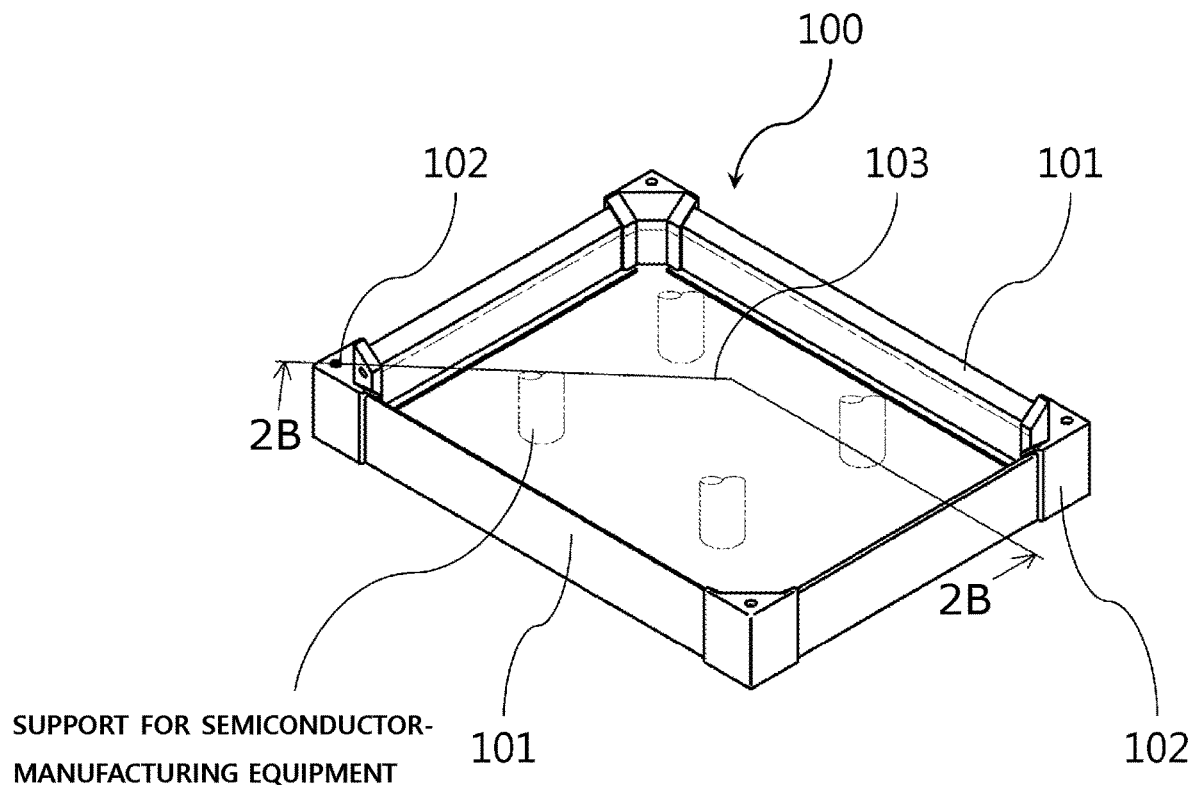
FIGS. 2A and 2B are views conceptually illustrating a dike for semiconductor-manufacturing equipment according to the present invention.
Figure 2B:
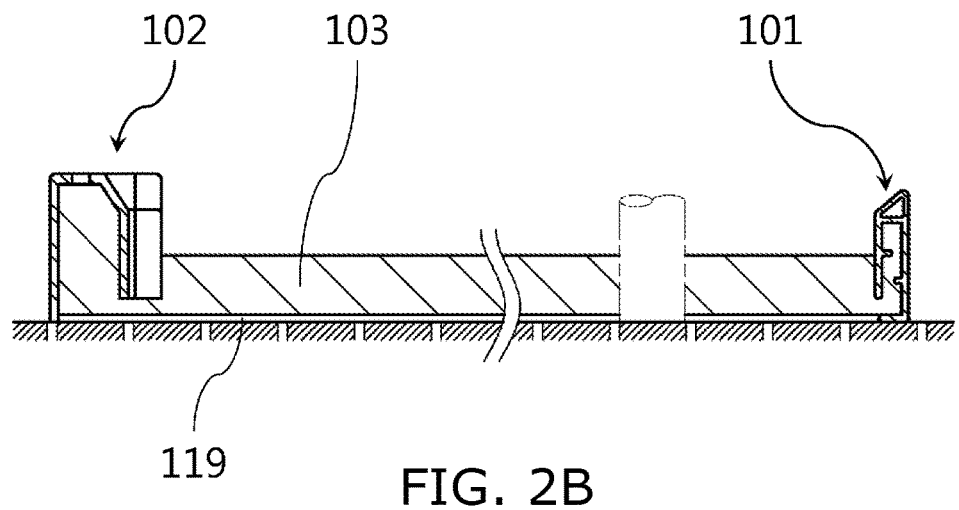

As shown in FIGS. 2A and 2B, the present invention relates to a dike 100 for collecting and processing liquid that leaks or scatters from semiconductor-manufacturing equipment installed on a porous floor of a building, in which a plurality of straight blocks 101 and a plurality of corner blocks 102, having a predetermined height, are engaged to form a fence having a predetermined shape and a predetermined area in a predetermined region around the semiconductor-manufacturing equipment, and an epoxy 103 in a molten state is injected to a predetermined height in the space within the fence and solidified.

Figure 3:
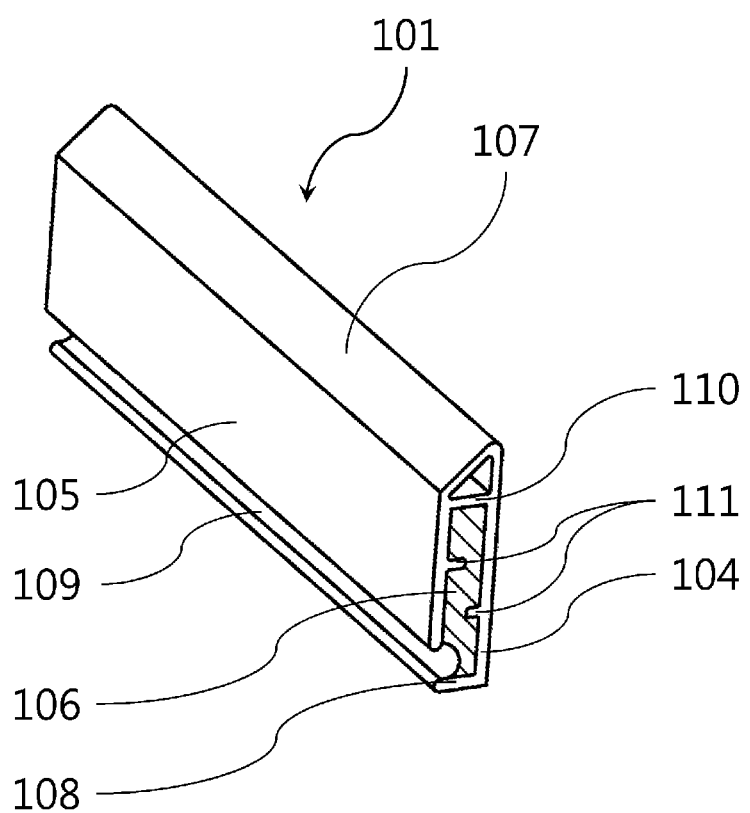
FIG. 3 is a view illustrating a straight block of the dike for semiconductor-manufacturing equipment according to the present invention.

As shown in FIG. 3, the straight block 101 includes an outer vertical wall 104 and an inner vertical wall 105, which are formed to have a predetermined length and a predetermined height by injection-molding synthetic resin and are spaced apart from each other by a predetermined width to form a space in which a straight block epoxy 106 is injected. The upper end of the outer vertical wall and the upper end of the inner vertical wall are connected to each other via an inclined panel 107, which is disposed above the space filled with the linear block epoxy and is inclined downwards toward the inner vertical wall.

In addition, an installation panel 108 is bent at a right angle at the lower end of the outer vertical wall 104 and extends to the inner vertical wall 105 in order to form the bottom of the epoxy-injected space and to enable vertical installation of the straight block 101 on the floor of the building.

The inner vertical wall 105, which vertically extends downwards from the inclined panel 107, is shorter than the outer vertical wall 104 so as to form a communication portion 109, which communicates with the space within the fence forming the dike 100. The epoxy 103 in a molten state, which is injected in the space within the fence of the dike 100, is connected to the straight block epoxy 106 in a solidified state, and is solidified so as to be integrated with the straight block epoxy 106.

A partition wall 110 is formed between the lower end of the inclined panel 107 and the outer vertical wall 104 in order to maintain a constant width of the space between the inner vertical wall 105 and the outer vertical wall 104, in which the straight block epoxy 106 is injected and solidified. Reinforcement walls 111 are protrudingly formed on the surfaces of the outer vertical wall and the inner vertical wall that define the space in which the straight block epoxy 106 is injected and solidified so as to be misaligned from each other in the vertical direction and to extend in the longitudinal direction of the straight block 101 in order to allow adhesion of the straight block epoxy 106 thereto and to increase the strength of the walls.

The inclined panel 107, which is formed at the upper end of the straight block 101 so as to be inclined downwards toward the inner vertical wall 105, functions to guide liquid falling on the top surface of the fence of the dike from the semiconductor-manufacturing equipment such that the liquid does not flow out of the fence of the dike but collects in the space within the fence of the dike.

Figure 4:
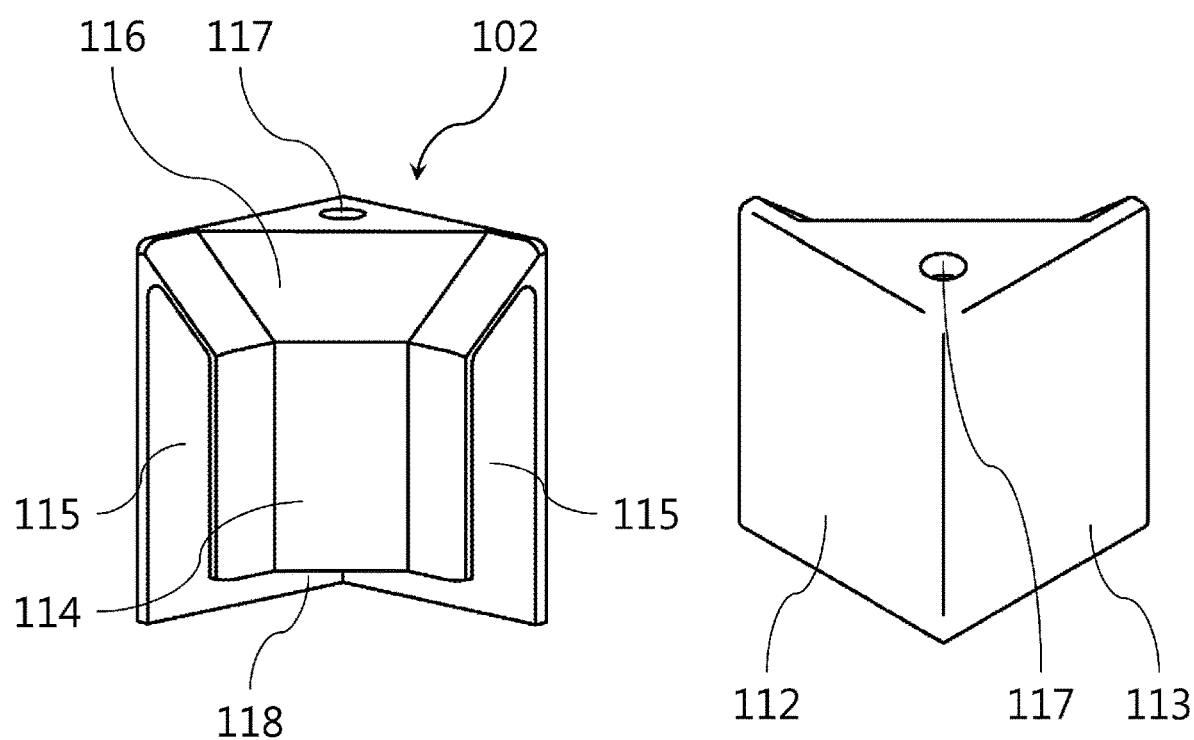
FIG. 4 illustrates a corner block of the dike for semiconductor-manufacturing equipment according to the present invention.

As shown in FIG. 4, the corner block 102 includes a first rear vertical panel 112 and a second rear vertical panel 113, which have a predetermined width and a predetermined height and are integrally formed so as to be connected to each other with a predetermined included angle formed therebetween, and a front vertical panel 114, which is integrally formed so as to be connected to the front surfaces of the first rear vertical panel and the second rear vertical panel. Coupling gaps 115, into which the end portions of neighboring straight blocks 101 are fitted, are respectively formed between the first rear vertical panel 112 and the front vertical panel 114 and between the second rear vertical panel 113 and the front vertical panel 114.

Figure 5A:
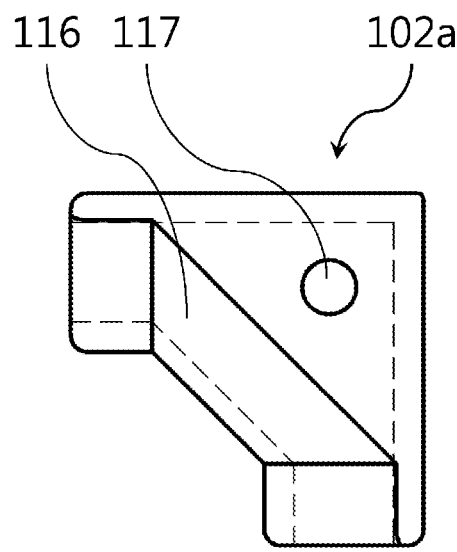
FIGS. 5A to 5C are views illustrating examples of the included angle formed between coupling gaps of the corner block of the dike for semiconductor-manufacturing equipment according to the present invention.
Figure 5B:
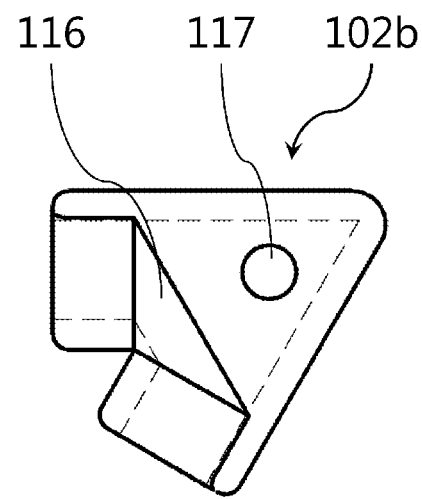
Figure 5C:
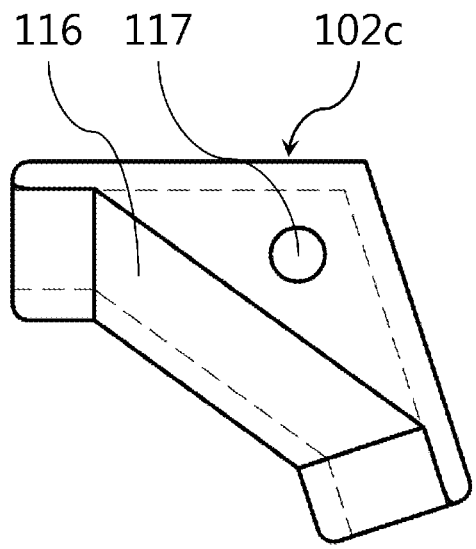
Figure 6A:
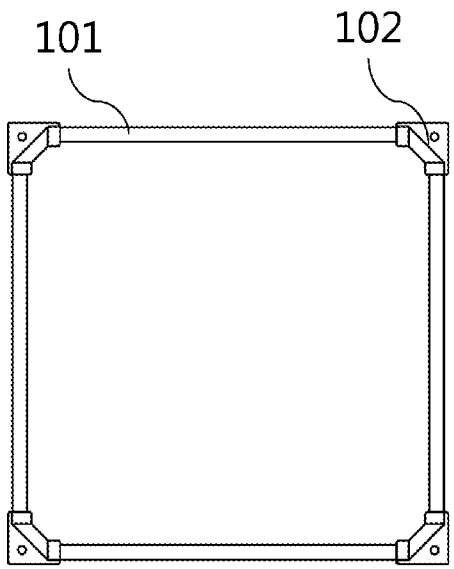
FIGS. 6A to 6D are views illustrating examples of the shape of a fence of the dike for semiconductor-manufacturing equipment according to the present invention.
Figure 6B:
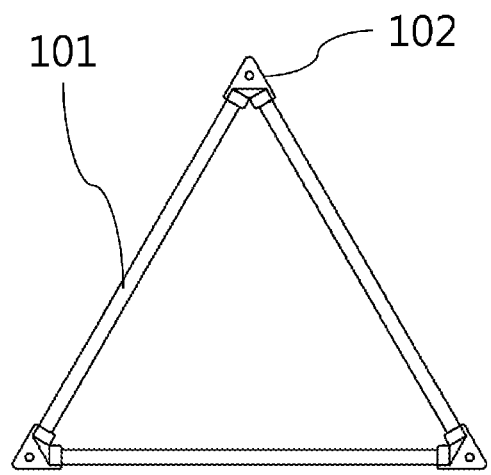
Figure 6C:
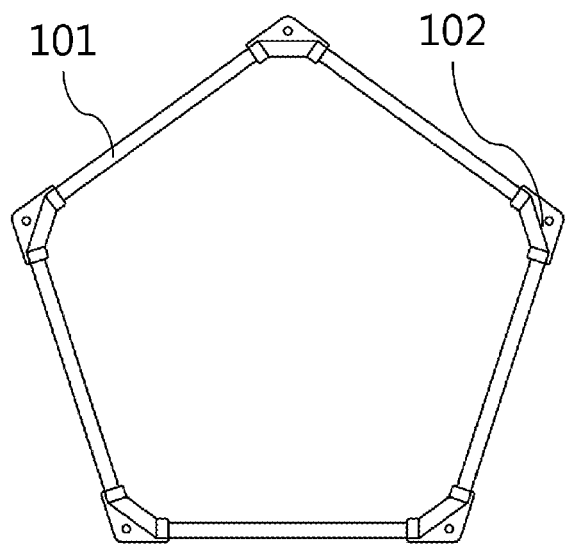
Figure 6D:
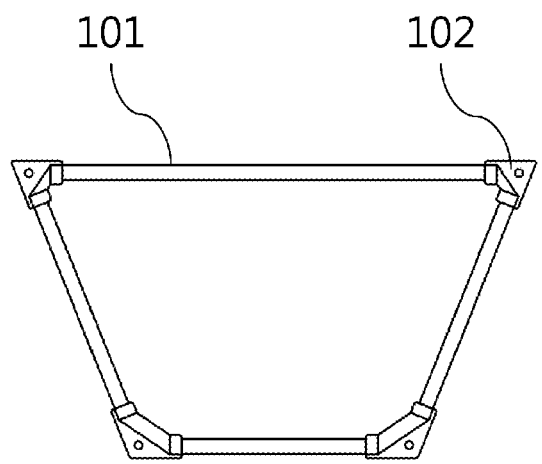

The coupling gaps 115 are provided in a pair so as to be connected to each other with a predetermined included angle formed therebetween with respect to the corner. Examples of the corner block 102 include a right-angle corner block 102a, in which the included angle is a right angle (refer to FIG. 5A), an acute-angle corner block 102b, in which the included angle is an acute angle (refer to FIG. 5B), and an obtuse-angle corner block 102c, in which the included angle is an obtuse angle (refer to FIG. 5C).

As shown in FIGS. 6A to 6D, the fence of the dike 100 is formed using the above-described examples of the corner block 102, specifically, using any one selected from among the right-angle corner block 102a, the acute-angle corner block 102b, and the obtuse-angle corner block 102c, or combinations thereof.

The right-angle corner block 102a, the acute-angle corner block 102b, and the obtuse-angle corner block 102c are appropriately selected to form the fence of the dike 100 so as to be suitable for a region liable to be contaminated by the semiconductor-manufacturing equipment, thereby improving efficiency of use of the floor of the building on which the semiconductor-manufacturing equipment is installed, minimizing installation of the dike on an unnecessary region, and thus reducing the installation costs of the dike.

In addition, as shown in 4, the corner block 102 further includes a corner block inclined panel 116, which is inclined upwards in order to connect the upper end of the front vertical panel 114, which is disposed in front of the first rear vertical panel 112 and the second rear vertical panel 113, to the upper ends of the first rear vertical panel 112 and the second rear vertical panel 113.

Similar to the inclined panel 107 of the straight block 101, the corner block inclined surface 116 of the corner block 102 functions to guide liquid falling on the top surface of the corner block of the fence of the dike from the semiconductor-manufacturing equipment such that the liquid does not flow out of the fence of the dike but collects in the space within the fence of the dike.

The corner block 102 has an epoxy injection hole 117 formed in the center portion of the corner block inclined panel 116 or in the top surface of the corner block. Although not illustrated, in the state in which the straight block 101 is fitted into the corner block 102, molten epoxy is injected through the epoxy injection hole 117 so that the corner block and the straight block are securely coupled to each other by the epoxy. The epoxy injection hole is sealed after the injection of the molten epoxy.

The fence of the dike 100 according to the present invention is formed by fitting the end portions of two adjacent ones of the plurality of straight blocks 101 into a corresponding one of the plurality of corner blocks 102, and the installation panels 108 of the straight blocks are bonded to the floor of the building. As such, it is possible to quickly and conveniently form the fence of the dike and install the same.

In addition, as shown in FIG. 4, the corner block 102 has an epoxy passage 118 formed below the front vertical panel 114 by making the front vertical panel 114 shorter than the first rear vertical panel 112 and the second rear vertical panel 113. In the state in which the corner block 102 and the straight block 101 are coupled to each other and bonded to the floor of the building, the epoxy injected in the corner block 102 and the epoxy applied to the floor inside the fence of the dike 100 mix with each other and are integrally solidified, as shown in FIG. 2B.

As shown in FIG. 2B, the epoxy injected in the dike may be formed as a horizontal epoxy 103 having a uniform thickness on the floor inside the fence of the dike. Alternatively, as shown in FIGS. 7A to 8B, an inclined epoxy block 103b, having an inclined surface inclined at a predetermined angle, may be mounted on the horizontal epoxy 103a in order to easily and quickly collect contaminants, particularly liquid contaminants, that enter the dike.

The inclined epoxy block 103b is formed as a separate solidified epoxy block using the same material as the horizontal epoxy 103a applied to the floor inside the fence of the dike, and is mounted to the top surface of the horizontal epoxy 103a injected in the space within the fence of the dike.

The mounting structure of the inclined epoxy block 103b will now be described. When the horizontal epoxy 103a injected in the space within the fence of the dike is in the molten state before solidifying, the inclined epoxy block 103b may be placed on the horizontal epoxy 103a, and additional molten epoxy may be applied to the region around the inclined epoxy block 103b so that the inclined epoxy block is integrated with the fence of the dike and the horizontal epoxy. Alternatively, after the horizontal epoxy 103a injected in the space within the fence of the dike solidifies, the inclined epoxy block 103b may be placed on the horizontal epoxy, and additional molten epoxy may be injected into the gap between the inclined epoxy block and the horizontal epoxy so that the inclined epoxy block is integrated with the fence of the dike and the horizontal epoxy.

Figure 7A:
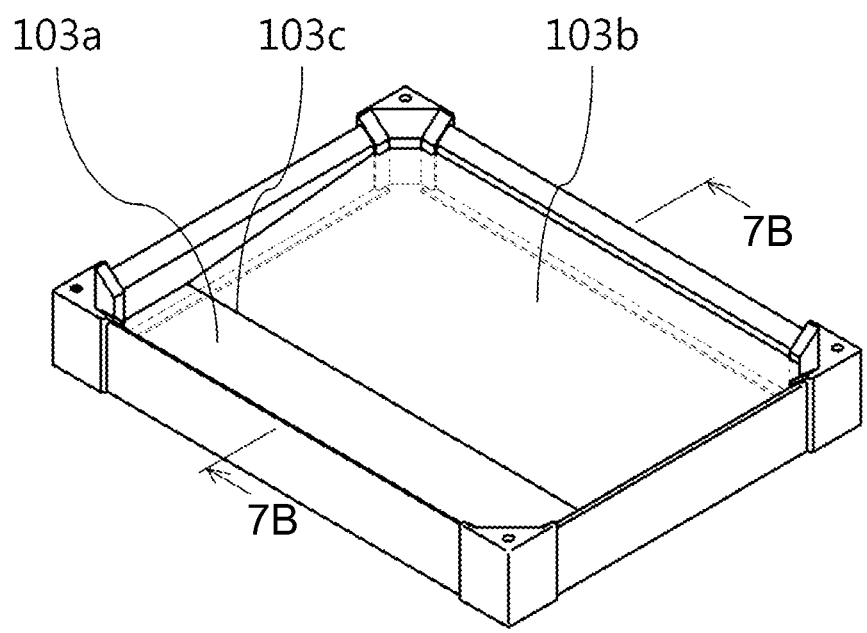
FIGS. 7A and 7B are views illustrating one embodiment in which an epoxy surface is formed in the shape of an inclined surface in the dike according to the present invention.
Figure 7B:
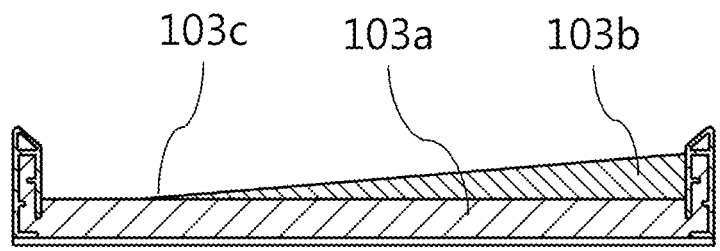
Figure 8A:
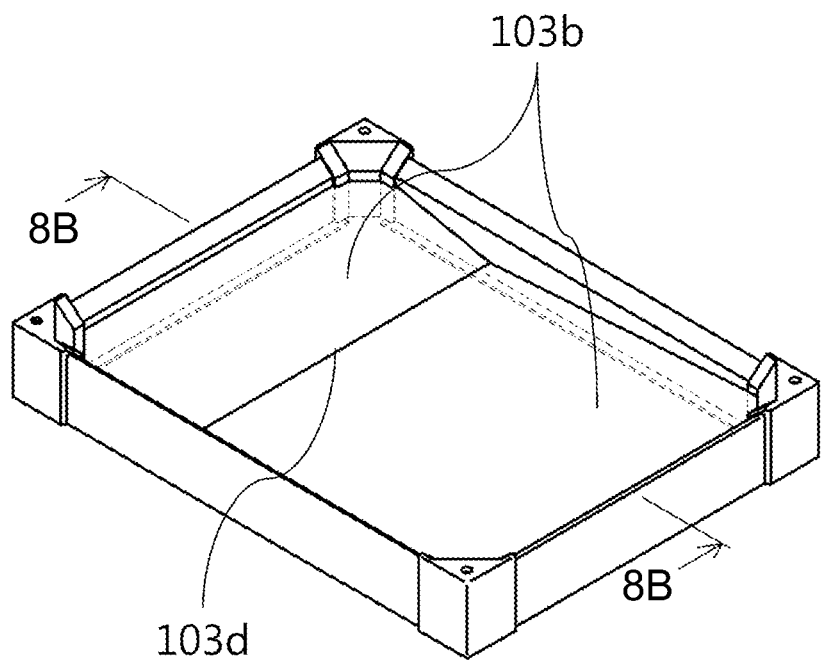
FIGS. 8A and 8B are views illustrating another embodiment in which an epoxy surface is formed in the shape of an inclined surface in the dike according to the present invention.
Figure 8B:
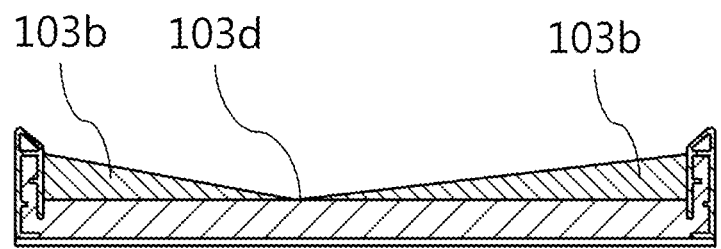

In addition, in the case in which the inclined epoxy block 103b is mounted on the horizontal epoxy 103a, a discharge path for discharging contaminants is formed at the lower end of the inclined surface of the inclined epoxy block 103b. As shown in FIG. 7B, a transverse discharge path 103c may be formed at the lower end of the inclined surface. Alternatively, as shown in FIG. 8B, a plurality of inclined epoxy blocks 103b, which have surfaces inclined at different respective angles, may be connected such that a longitudinal discharge path 103d is formed between the inclined surfaces. The discharge path is not limited to a transverse discharge path or a longitudinal discharge path, but may be formed in any of various discharge path types depending on the shape of the inclined surface of the inclined epoxy block.

Due to the contaminant discharge path formed on the epoxy injected in the space within the fence of the dike, contaminants generated in the semiconductor-manufacturing equipment may gather at a specific spot in the dike, thereby facilitating collection of the contaminants, particularly improving convenience and efficiency in collecting liquid contaminants.

In addition, as shown in FIG. 2B, a TEFLON sheet 119 having an adhesive attached to the bottom surface thereof is adhered to the floor inside the fence of the dike, and molten epoxy is applied to the top surface of the TEFLON sheet and solidified. Accordingly, it is easy to remove the epoxy adhered to the floor inside the fence of the dike when moving or dismantling the semiconductor-manufacturing equipment.

As is apparent from the above description, the present invention provides a dike for semiconductor-manufacturing equipment in which a polygonal-shaped fence having corners is formed by fitting end portions of a plurality of straight blocks into a plurality of corner blocks and in which the bottom surfaces of the straight blocks are bonded to a floor of a building, thereby enabling accurate, quick and convenient installation of the fence of the dike on the floor around semiconductor-manufacturing equipment without using separate fixtures.

In addition, corner blocks having respectively different angles are provided and are appropriately selected so that the dike is formed so as to be suitable for any of various shapes of floors of a building or a region liable to be contaminated by semiconductor-manufacturing equipment, thereby improving efficiency of use of the floor of the building on which the semiconductor-manufacturing equipment is installed, minimizing installation of the dike on an unnecessary region, and thus reducing the installation costs of the dike.

In addition, an epoxy is injected in the gap between an outer vertical wall and an inner vertical wall of the straight block, and is integrated with the epoxy injected in the space within the fence of the dike, thereby increasing the solidity of the straight block and the fence of the dike.

In addition, an inclined epoxy block is mounted in the space within the fence of the dike in order to provide a contaminant discharge path, thereby enabling easy and quick collection of contaminants through the discharge path.

Although preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A dike for semiconductor/LCD manufacturing and processing equipment,
   comprising a plurality of straight blocks having a first predetermined height is fitted into coupling gaps formed in a plurality of corner blocks to form a fence having a predetermined shape and a predetermined area, and an epoxy in a molten state is injected to a second predetermined height in a space within the fence and solidified to form a horizontal epoxy in the space within the fence,
   wherein each of the plurality of straight blocks comprises an outer vertical wall and an inner vertical wall, spaced apart from each other by a first predetermined width to form a space with epoxy injected within the space between the outer vertical wall and an inner vertical wall, and an inclined panel disposed above the space so as to be inclined downwards toward the inner vertical wall to connect an upper end of the outer vertical wall to an upper end of the inner vertical wall,
   wherein each of the plurality of corner blocks comprises a first rear vertical panel and a second rear vertical panel, having a second predetermined width and a third predetermined height and integrally formed so as to be connected to each other with a predetermined included angle formed therebetween, and
   an inclined epoxy block, configured as a solidified block having an inclined surface inclined at a predetermined angle, is mounted on the horizontal epoxy to form a contaminant discharge path at a lower end of the inclined surface.

2. The dike for semiconductor/LCD manufacturing and processing equipment according to claim 1, wherein each of the plurality of straight blocks is formed to have a predetermined length and the first predetermined height by injection-molding synthetic resin, and further comprises an installation panel bent at a right angle at a lower end of the outer vertical wall and extending to the inner vertical wall to enable vertical installation of each of the plurality of straight blocks on a floor of a building,
   wherein the inner vertical wall is shorter than the outer vertical wall in order to form a communication portion, and
   wherein the communication portion communicates with the space within the fence, and the epoxy in a molten state, injected in the space within the fence, flows into the space formed by the outer vertical wall and the inner vertical wall as a straight block epoxy and is connected to the horizontal epoxy in a solidified state so as to be integrated with the horizontal epoxy.

3. The dike for semiconductor/LCD manufacturing and processing equipment according to claim 1, wherein the plurality of corner blocks having the predetermined included angle is selected from the group comprising a right-angle corner block having a right included angle, an acute-angle corner block having an acute included angle, and an obtuse-angle corner block having an obtuse included angle and combinations thereof.

4. The dike for semiconductor/LCD manufacturing and processing equipment according to claim 1, wherein a polytetrafluoroethylene sheet, having an adhesive attached to a bottom surface thereof, is adhered to a floor inside the fence, and the molten epoxy is applied to a top surface of the polytetrafluoroethylene sheet and solidified so as to facilitate removal of the epoxy from the floor when moving or dismantling semiconductor/LCD manufacturing and processing equipment.

* * * * *